United States Patent [19]

Rudy, Jr. et al.

[11] Patent Number: 5,376,011
[45] Date of Patent: Dec. 27, 1994

[54] INTEGRAL SHELL FOR TANDEM CIRCUIT CARD CONNECTORS

[75] Inventors: William J. Rudy, Jr., Annville; Howard R. Shaffer, Millersburg; Daniel E. Stahl, Hummelstown, all of Pa.

[73] Assignee: The Whitaker Corporation, Wilmington, Del.

[21] Appl. No.: 76,616

[22] Filed: Jun. 11, 1993

[51] Int. Cl.⁵ .............................................. H01R 23/70
[52] U.S. Cl. ...................................... 439/79; 439/248; 439/487
[58] Field of Search ................... 439/70, 80, 247, 248, 439/607, 608, 108, 487

[56] References Cited

U.S. PATENT DOCUMENTS

| | | | |
|---|---|---|---|
| 3,488,623 | 1/1970 | Stephenson et al. | 439/248 |
| 3,491,330 | 1/1970 | Barnhart et al. | 439/681 |
| 4,451,107 | 5/1984 | Dola et al. | 439/65 |
| 4,509,258 | 4/1985 | Locati et al. | 29/876 |
| 4,582,374 | 4/1986 | Conrad et al. | 339/17 M |
| 4,715,829 | 12/1987 | Preputnick | 439/660 |
| 4,735,583 | 4/1988 | Rudy, Jr. et al. | 439/350 |
| 4,808,115 | 2/1989 | Norton et al. | 439/79 |
| 4,846,699 | 7/1989 | Glover et al. | 439/64 |
| 4,939,454 | 7/1990 | Miner | 324/158 F |
| 4,995,821 | 2/1991 | Casey | 439/157 |
| 5,151,036 | 9/1992 | Fusselman et al. | 439/108 |
| 5,184,961 | 2/1993 | Ramirez et al. | 439/248 |
| 5,194,010 | 3/1993 | Dambach et al. | 439/79 |
| 5,238,413 | 8/1993 | McCaffrey et al. | 439/79 |
| 5,288,246 | 2/1994 | Whiteman, Jr. | 439/571 |

*Primary Examiner*—Neil Abrams
*Attorney, Agent, or Firm*—Anton P. Ness

[57] ABSTRACT

An integral shell (150) for connectors (102,132) mounted to an edge of a circuit card (100,130). The connectors are secured in cavities (152) of the shell, and the cavities are precisely referenced to a single datum defined by an alignment or datum post (160). A corresponding alignment hole (162) of the circuit card is precisely positioned with reference to the arrays of termini of the circuits, and upon mounting of the shell to the card with the datum post (160) received in the alignment hole (162), the contact sections of the terminals of the several connectors (102,132) remain precisely aligned with the termini and their terminations protected against stress during handling, mating and unmating.

8 Claims, 11 Drawing Sheets

INTEGRAL SHELL FOR TANDEM CIRCUIT CARD CONNECTORS

FIELD OF THE INVENTION

The present invention relates to electrical connectors for circuit cards and more particularly to protective shells therefor.

BACKGROUND OF THE INVENTION

Card cages are known, in which a framework is provided to define a card receiving region in which pairs of card guides establish locations for insertion of daughter cards therealong, for connectors mounted at a leading edge of each thereof to mate with corresponding connectors of a backplane traversing the rear of the card receiving region. The backplane provides for electrical connections of the circuits of each daughter card inserted to circuits of other daughter cards as desired or to conductors of input/output cable. One such card cage is disclosed in U.S. Pat. No. 4,846,699 directed to a system for providing electrical power to the components mounted on the daughter cards.

A backplane is disclosed in U. S. Pat. No. 4,582,374 which interconnects a high density of signal circuits of cards mountable along a front face thereof with corresponding circuits along a back face thereof, as well as providing power interconnections and ground.

Another particular form of card cage is disclosed in U.S. Pat. No. 4,808,115 in which circuit cards mounted within modules are insertable into an enclosure or box commonly referred to as a black box and containing a mother board to which the circuit cards are interconnected. The modules are referred to as line replaceable modules.

Aircraft have a great many electrical circuits interconnecting a variety of electrical articles thereon such as black boxes, sensors, instrument panels and the like, and the circuits are commonly interconnected in regions termed electronics bays. Various arrangements have been devised to provide for disconnectable interconnections of the circuits and are known as wire integration systems. Two such systems are disclosed in U. S. Pat. No. 4,735,583 and 4,995,821. Discrete wire conductors are used to define the interconnections.

Electrical connectors are known which are mounted to edges of daughter cards and which are matable with connectors of a backplane to provide a high density of electrical connections between the circuits of the daughter card and circuits of the backplane. In addition to connectors disclosed in U.S. Pat. Nos. 4,808,115 and 4,846,699 and 4,582,374, another such connector is disclosed in U.S. Pat. No. 4,715,829.

It is desired to provide an arrangement for protecting the terminations of several arrays of terminals along the leading edge of a daughter card with the circuits of the daughter card, when the daughter card is subjected to stresses during insertion into a card cage and mating to corresponding connectors of a backplane.

SUMMARY OF THE INVENTION

The present invention is an integral rugged conductive shell member mounted to circuit card, such as a daughter card, along a leading edge thereof and in cavities of which are mountable connectors containing arrays of terminals matable to terminals in corresponding mating connectors such as of a backplane or motherboard. The integral shell is securable to the daughter card by conventional mounting hardware at each end and includes a centrally located mounting post which is precisely positioned with respect to the arrays of the circuit termini of the daughter card when inserted into a corresponding reference hole of the circuit card and thus defines a datum or reference for the electrical contacts contained in the dielectric housings of the connectors. This arrangement assures that the positions of the terminals assembled within respective passageways of the housings and electrically connected to the respective termini, are maintained by the housings within the closefitting cavities of the integral shell, upon insertion of the datum post in the corresponding hole of the circuit card. This arrangement also enables use of standard styles of card-edge mountable connectors, by providing housing-receiving cavities of appropriate dimension and shape.

The integral shell further includes a forwardmost face which is adapted to initially engage leading edges of the corresponding connectors of the backplane assembly and incrementally laterally adjust the position thereof to precisely align the contacts therein with the associated contacts of the daughter card connectors for blind mating when the corresponding connectors are mounted within apertures of the backplane in a manner permitting incremental adjustment therewithin to precisely self-align the front contact sections of the arrays of electrical contacts with contact sections of corresponding arrays of complementary contacts of the card edge connectors mounted on the daughter cards for remote mating during daughter card insertion, enabling mating of the individual pairs of mating contacts.

The integral shell may have key members complementary with keys affixed to the interior panel so that only the appropriate daughter card is physically able to be fully inserted into the selected card location defined by the card-guiding channels for its connectors to mate with the card-associated connectors. Such an integral shell also assists in minimizing crosstalk between unrelated circuits and components within the junction box when electrically connected to a shielding metal layer of the daughter card, which is electrically connected to ground by the junction box.

It is an objective of the present invention to provide for referencing of terminals of more than one array and contained in multiterminal housings, with respect to corresponding termini of corresponding arrays proximate an edge of a circuit card, all simultaneously, to minimize stress on the terminations between the terminals and the card termini.

It is also an objective to provide a single shell for protecting more than one connector and which incorporate the means for such accurate terminal positioning into such shell.

It is a further objective to provide for accurate positioning of the arrays of contact sections of the several card-mounted connectors across the mating faces thereof, relative to corresponding contact sections of the several mating connectors, thus protecting the terminations of the terminals with the circuit card termini from stresses otherwise incurred during mating.

An embodiment of the present invention will now be described by way of example with reference to the accompanying drawings.

DETAILED DESCRIPTION OF THE PREFERRED EMBODIMENT

Figure 1:
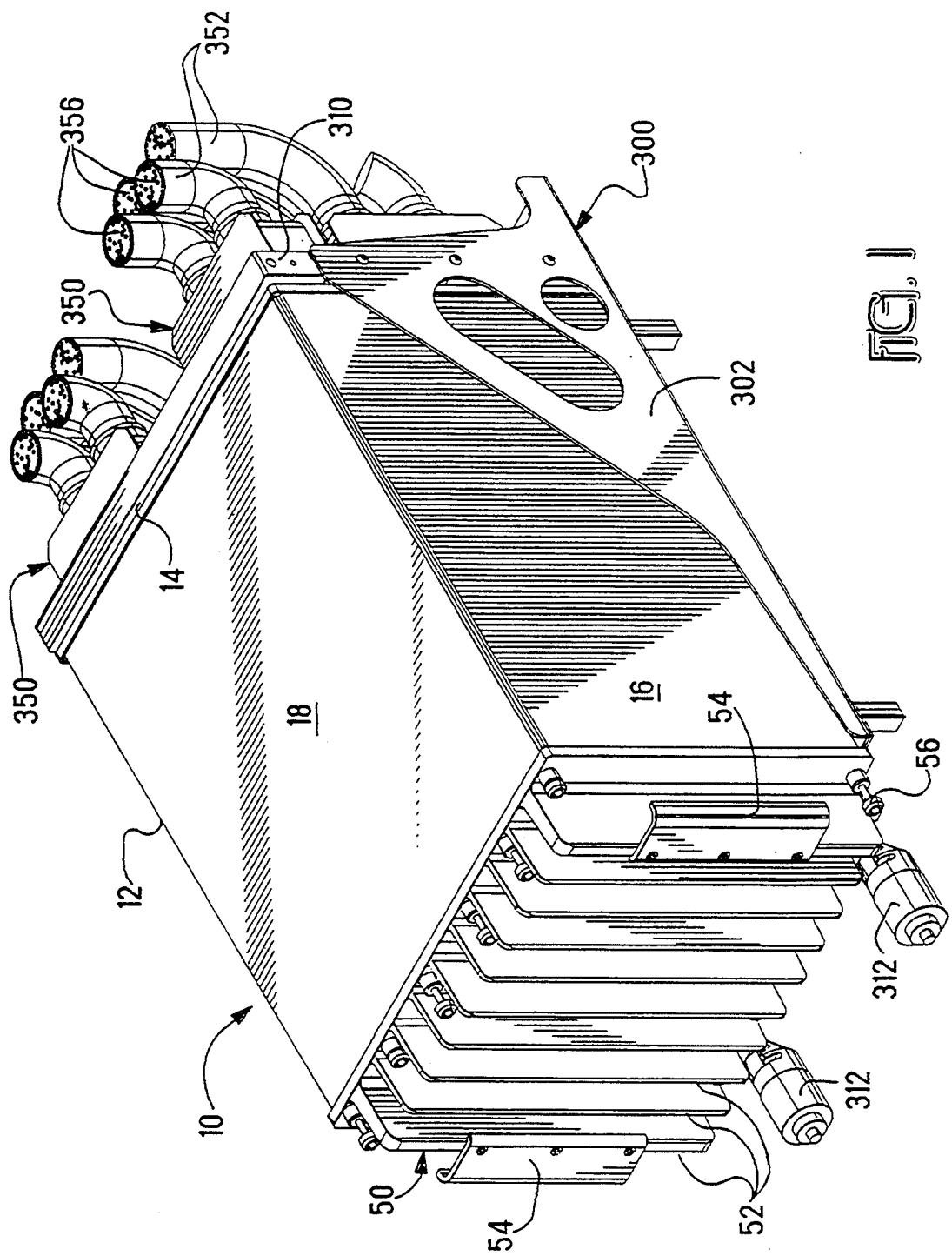
FIG. 1 is an isometric view of the junction box of the present invention secured in position within a rack assembly.
Figure 2:
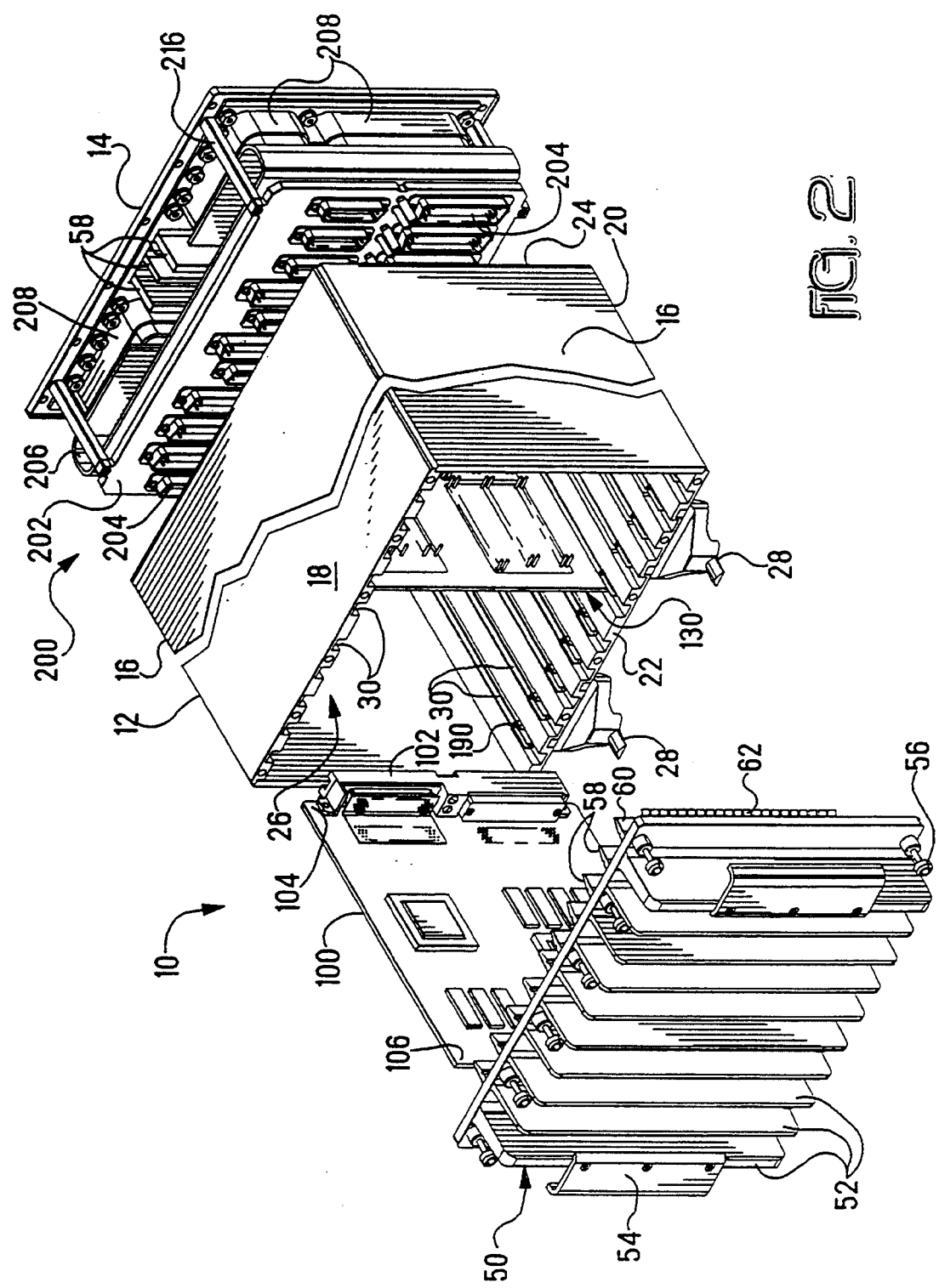
FIG. 2 is an exploded isometric view of the junction box of FIG. 1.
Figure 3:
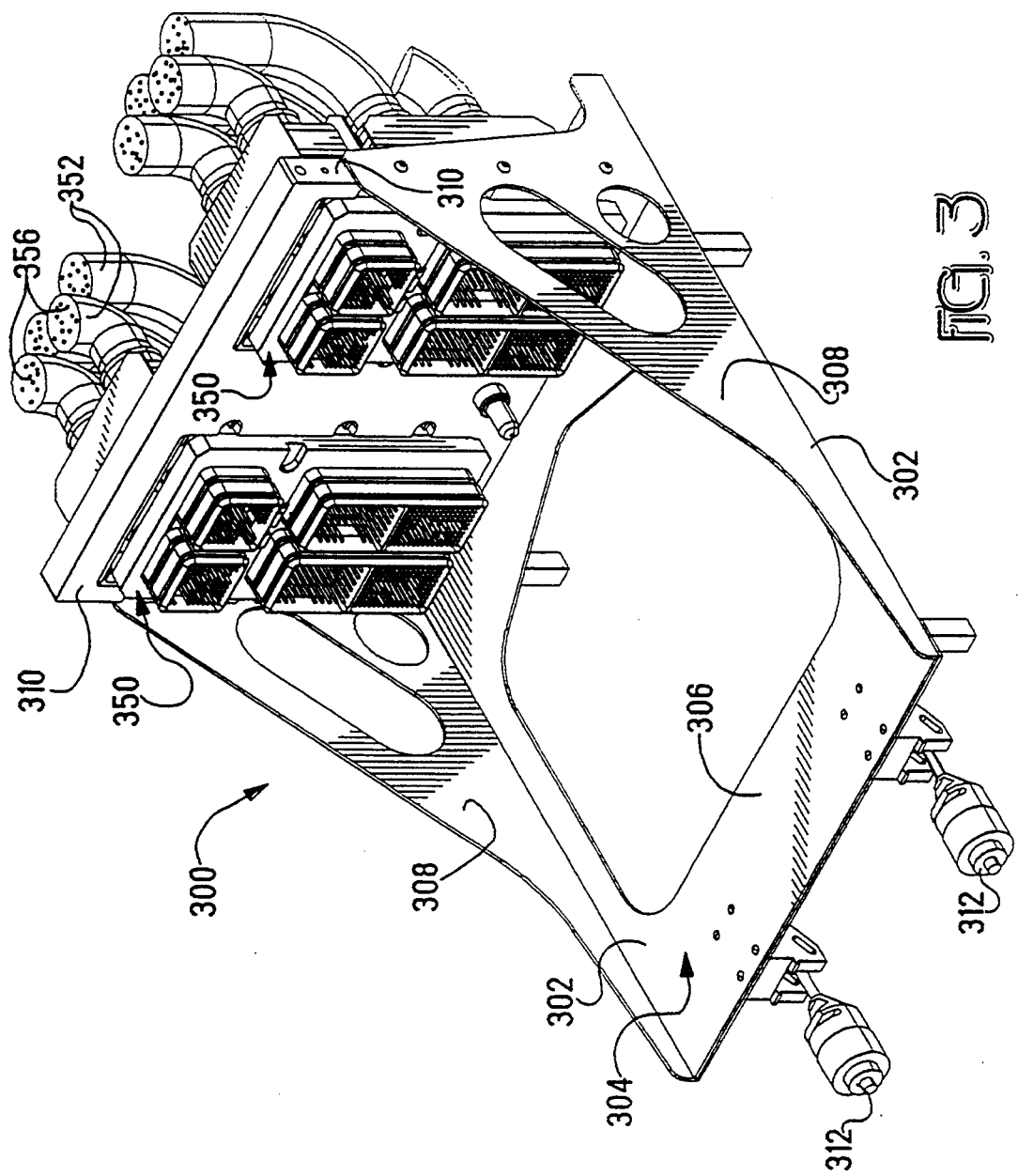
FIGS. 3 and 4 are isometric views of the rack assembly of FIG. 1, assembled and exploded respectively, showing the cable connectors mounted therein at the input/output interface of the junction box and the rack assembly.
Figure 4:
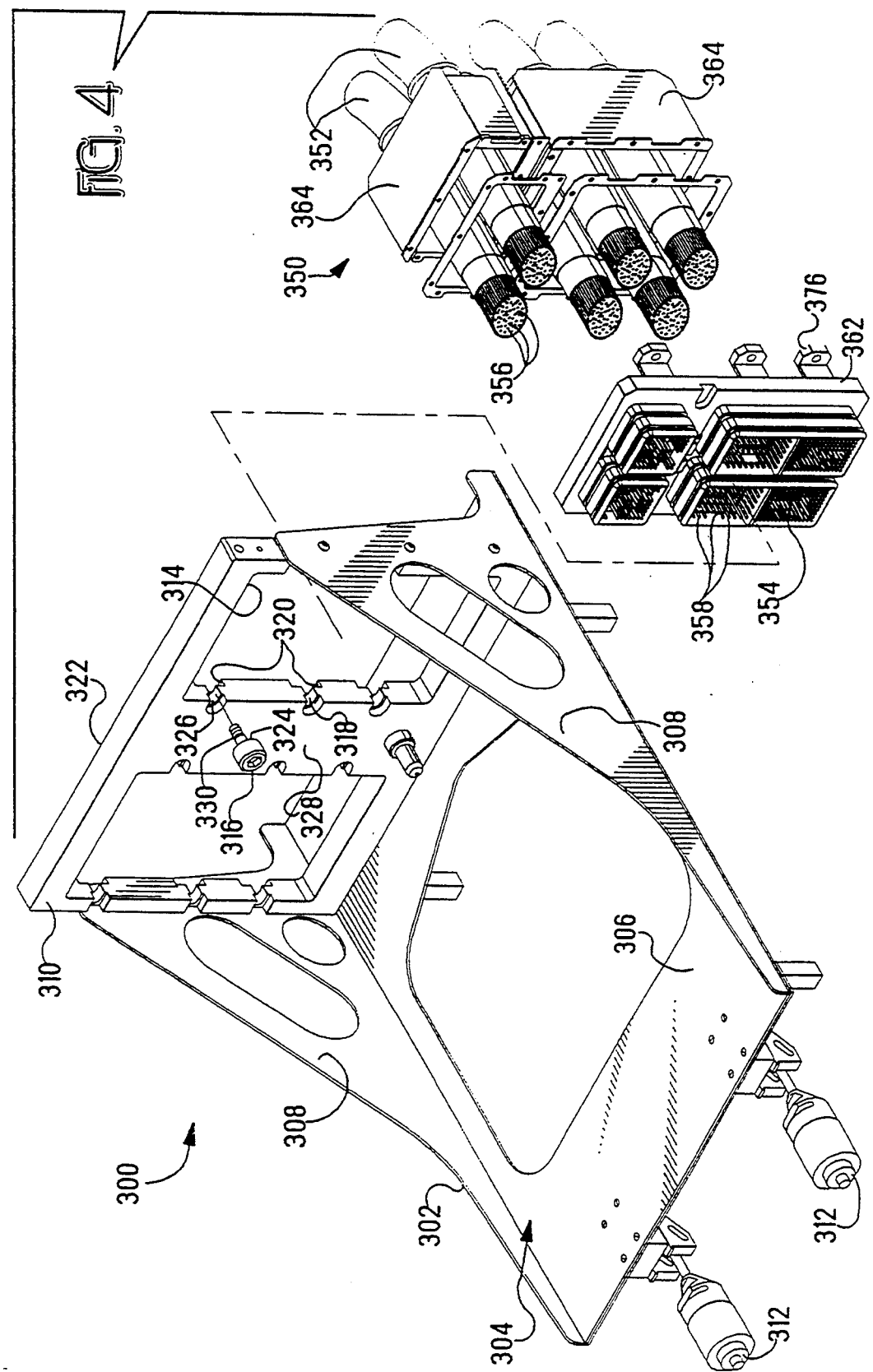
Figure 5:
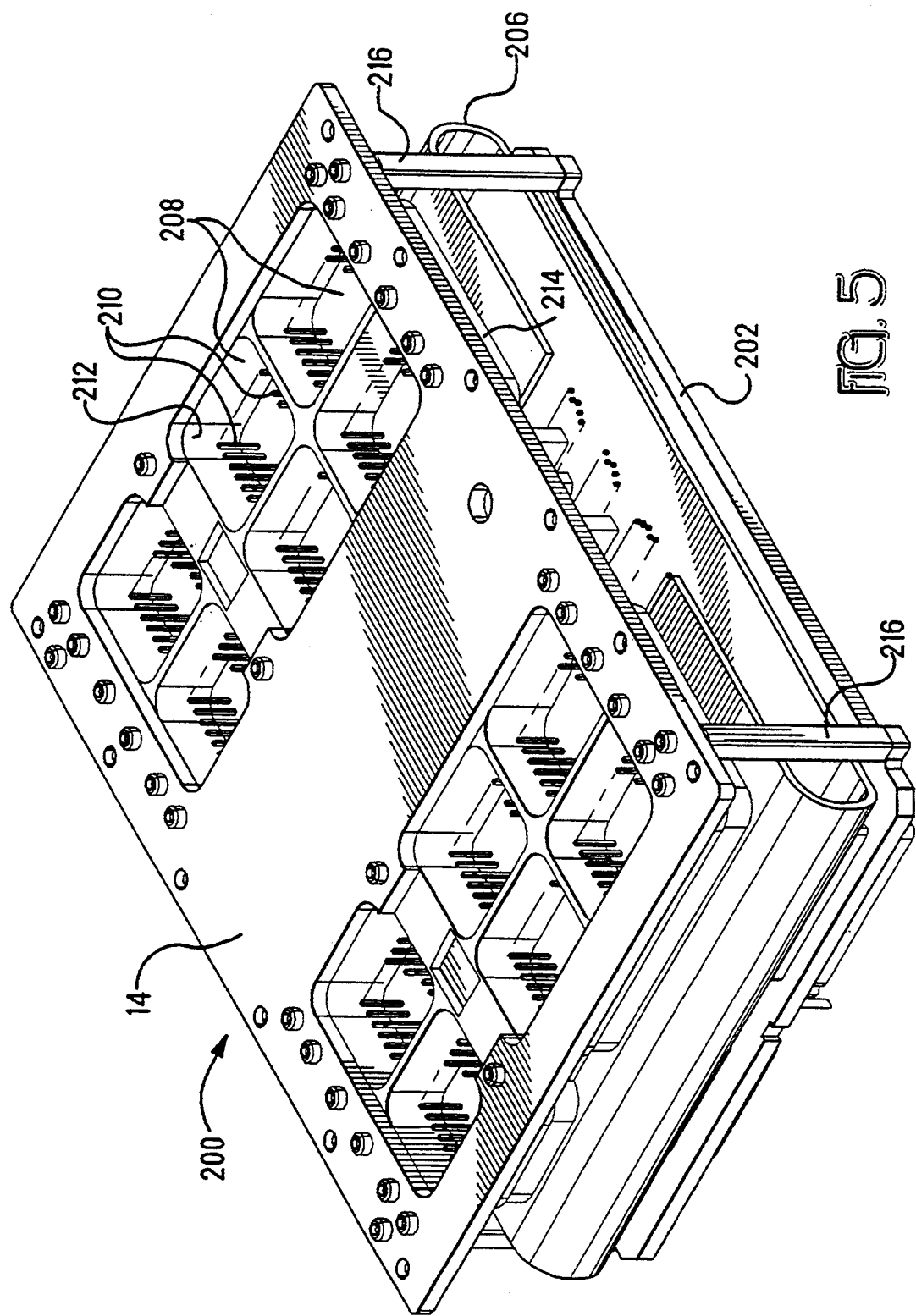
FIG. 5 is an isometric view of the rear wall of the junction box, which is part of the backplane assembly for the junction box, showing the input/output connectors thereof at the input/output interface.
Figures 8, 9:
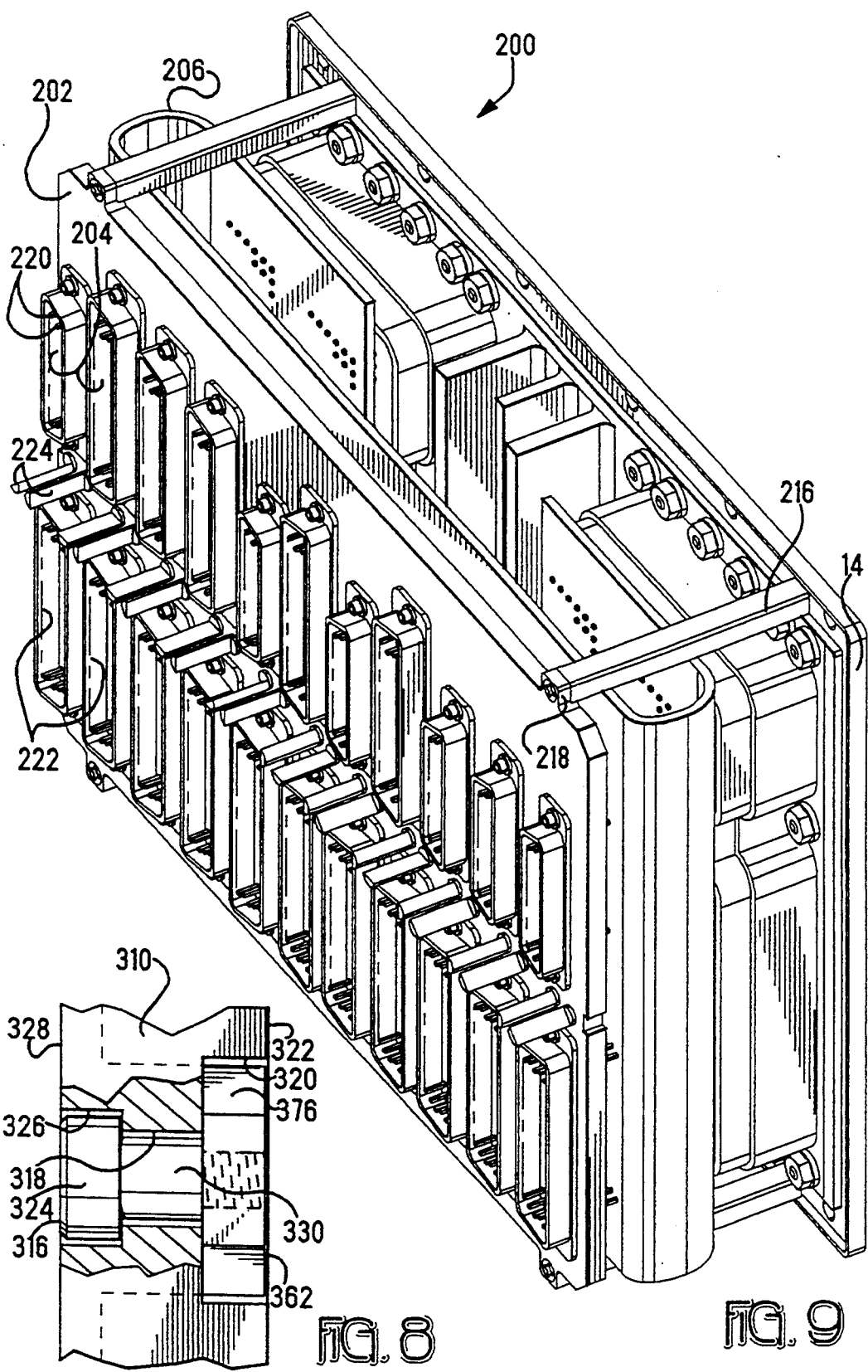
FIG. 8 is an enlarged section view of a float mount fastening arrangement of a cable connector in the frame of the rack assembly of FIGS. 3 to 7.
FIG. 9 is an isometric view of the backplane assembly showing the daughter card interface thereof within the junction box.

Junction box 10 of FIGS. 1 and 2 includes a box-like body section 12, front panel 50 and rear wall 14 with body section 12 having opposing side walls 16 and top wall 18 and bottom wall 20 and extends from front face 22 to rear face 24 defining a card-receiving region 26 extending inwardly from front face 22. Front panel 50 includes an array of exterior fins 52, to two of which are mounted a pair of handles 54 enabling manual gripping of the front panel for handling during removal from junction box 10, and is mountable to front face 22 using fasteners 56 secured about the periphery threaded into forward edges of the top and bottom walls 18,20. Junction box 10 is preferably used in conjunction with a rack assembly such as is shown in FIGS. 3 and 4 to which are secured cable-terminated connectors 350, with junction box 10 including a backplane assembly 200 such as shown in FIGS. 5 and 9 for interconnecting the cable's conductors with circuits of an array of daughter cards 100 in the junction box. Junction box 10 is disclosed in greater detail in U.S. patent application Ser. No. 08/076,654 filed Jun. 11, 1993.

In FIG. 1 junction box 10 is shown in position mounted within tray section 302 of rack assembly 300 for in-service use, with rack assembly 300 mounted on a shelf (not shown) within a structure such as an aircraft or ship. Junction box 10 is slidable along a box-receiving path 304 defined by bottom wall 306 and side walls 308, and is shown abutting panel member 310 traversing the end of box-receiving path 304. Panel member 310 is a rugged frame firmly affixed to tray section 302, and includes mounted thereto several electrical connectors 350 terminating a plurality of cables 352 containing multiple electrical conductors 354. Junction box 10 is locked in position using locking hardware 312 at the forward end of tray section 302, engaging locking embossments 28 depending from junction box 10 proximate front face 22.

Junction box 10 is shown in greater detail in FIG. 2, with card-receiving region 26 including opposing pairs of card guide channels 30 extending inwardly from front face 22 to define guides for insertion of circuit cards such as daughter card 100 and matrix card 130. Thus junction box is essentially a compact, fully enclosed card cage. Backplane assembly 200 is provided proximate rear face 24 and includes a forward wall section 202 traversing the inwardmost extent of card-receiving region 26. Mounted onto forward wall section 202 is an array of card-associated electrical connectors 204 matable with complementary connectors 102 affixed to leading edges 104,134 of daughter cards 100 and matrix card 130 (See FIG. 10). Backplane assembly 200 further includes interconnection circuitry 206 extending from forward wall section 202 to rearward wall section 14, which may comprise the rear wall of junction box 10 as shown if desired. Rear wall 14 includes mounted thereon an array of electrical input/output connectors 208 corresponding to connectors 350 mounted on frame member 310 of rack assembly 300. Preferably rear wall 14 is joined to forward wall section 202 by a plurality of struts 216 peripherally of interconnection circuitry 206, so that backplane assembly 200 is manipulatable as a unit or subassembly insertable into body section 12 of junction box 10 at rear face 24 whereafter rear wall 14 is fastenable to rear edges of side walls 16 and top and bottom walls 18,20 thereof.

Junction box 10 defines an integral rugged electrically conductive envelope surrounding the backplane assembly and daughter cards which provides protection against electromagnetic and radiofrequency interference to assure the integrity of signals received, processed and transmitted by the electronic circuitry and components therewithin. The junction box also provides heat dissipation for the components and interconnections therewithin which have become isolated from the otherwise cooling effect of ambient air flow usually relied upon to remove thermal energy from electronics bays. Side walls 16, top and bottom walls 18,20, rear wall 14 and front panel 50 are preferably formed of an electrically conductive alloy with superior thermal conductivity such as aluminum Alloy No. 6061 suitable for welding. Further preferably, all seams between the wall members of the junction box are tight fitting with resilient EMI gaskets used where necessary such as the mounting interface of the front panel with the front face, and at the openings in rear wall 14 for input/output connectors 208, thus eliminating all gaps which otherwise could permit EMI/RFI leakage into and out of the junction box.

The junction box thus provides a compact card cage of robust construction adapted to shield circuit cards and interconnections of circuits thereof with input/output conductors. With use of matrix card 130 or similar element the junction box has a circuit integration capability enabling simplification of the backplane assembly to become compact for a high population of circuit interconnections.

Embossments 28 are seen depending from bottom wall 20 at the front edge thereof, and are designed to be engaged by locking hardware 312 of rack assembly 300 when junction box 10 is inserted fully into rack assembly 300. By being affixed to bottom wall 20, locking hardware 312 and embossments 28 continue holding junction box 10 in its locked in-service position mated to panel member 310 of rack assembly 300 at the input-/output interface even when front panel 50 is removed from front face 22; the arrangement permits opening the junction box for insertion or removal of a particular daughter card while permitting all other daughter cards to remain in position with their circuits fully connected through the backplane assembly to the input/output conductors at the input/output interface at rear wall 14 and panel member 310 of rack assembly 300. Such capability greatly minimizes down time of an aircraft in which the junction box is mounted by rendering moot the necessity for retesting of the circuits and functions of the daughter cards not disconnected. Locking hardware may be of the extractor holddown type disclosed in U.S. Pat. No. 3,640,141.

Further seen in FIG. 2, front panel 50 includes an array of interior fins 58 associated with respective daughter cards 100 and extending to card-proximate ends 60 on which are mounted spring clips 62. Spring clips 62 are adapted to capture trailing ends 106 of all daughter cards simultaneously upon mounting of front panel 50 in place across front face 22 in a manner permitting simultaneous disengagement, to engage trailing ends 106 at pluralities of locations to establish thermal junctions therewith. The thermal junctions transfer heat from the daughter cards to the interior fins, and front panel 50 dissipates the heat from the daughter cards and interior of the junction box, especially through exterior fins 52. Rear wall 14 also is shown to have interior fins 58 which likewise provide heat dissipation benefits.

Rack assembly 300 is shown in FIGS. 3 and 4, and is of the type disclosed in U.S. patent application Ser. No. 08/076,655 filed Jun. 11, 1993. Bottom wall 306 and side walls 308 define a box-receiving path 304 extending to frame member 310, so that cable connectors 350 mounted thereon are positioned to become mated with corresponding input/output connectors 208 of the rear wall of the junction box when junction box 10 is fully installed by being moved along box-receiving path 304. The arrangement permits all cables 352 to be installed as complete cable harnesses into an aircraft (along with rack assembly) separate in time from installation of the junction box, and permitting automatic mating of the connectors merely upon junction box being installed. Cable connectors 350 are mounted to frame member 310 by shell members 362 being positioned within cutouts 314, with flanges 376 of shell members 362 being disposed within recesses 320 along rearward surface 322 of frame member 310 and fastened thereto by fasteners 316. Fasteners 316 include head portions 324 received into recesses 326 along forward surface 328 of frame member 310 and include shanks 330 extending through apertures 318 to be threaded into flanges 376. Flanges 376 are seen to be dimensioned slightly smaller than recesses 320, and fastener heads 324 also dimensioned slightly smaller than recesses 326 as shanks are less in diameter than apertures 318, all permitting lateral incremental movement of "float" of shell member 362 during connector mating. Backshells 364 are shown rearwardly of shell members 362, surrounding end portions of cables 352, with two styles of grounding of drain wires seen in FIGS. 6 and 7.

Figure 6:
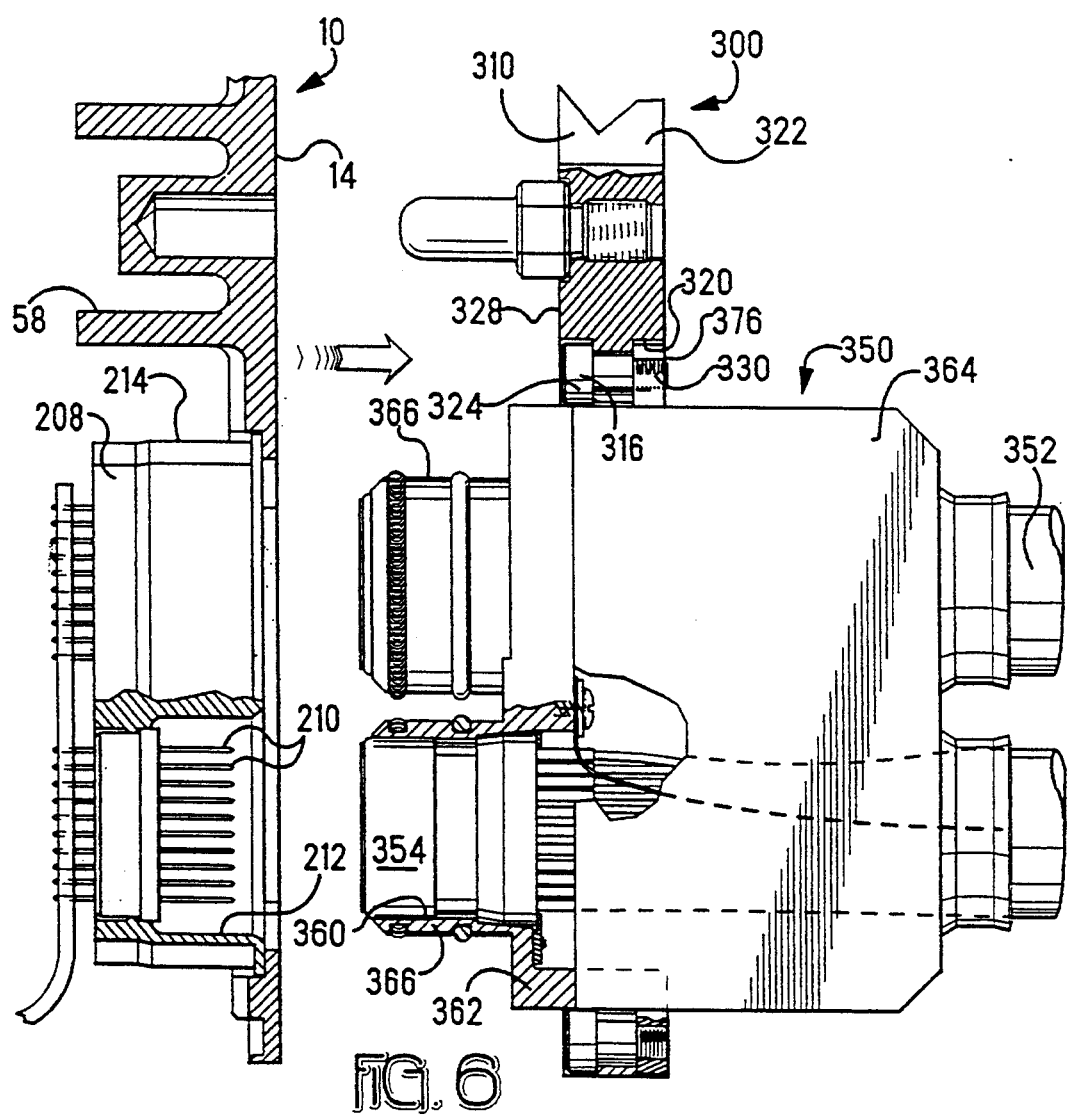
FIGS. 6 and 7 are part plan views and elevation views in cross-section of the input/output interface between the junction box and rack assembly of FIGS. 1 to 5.
Figure 7:
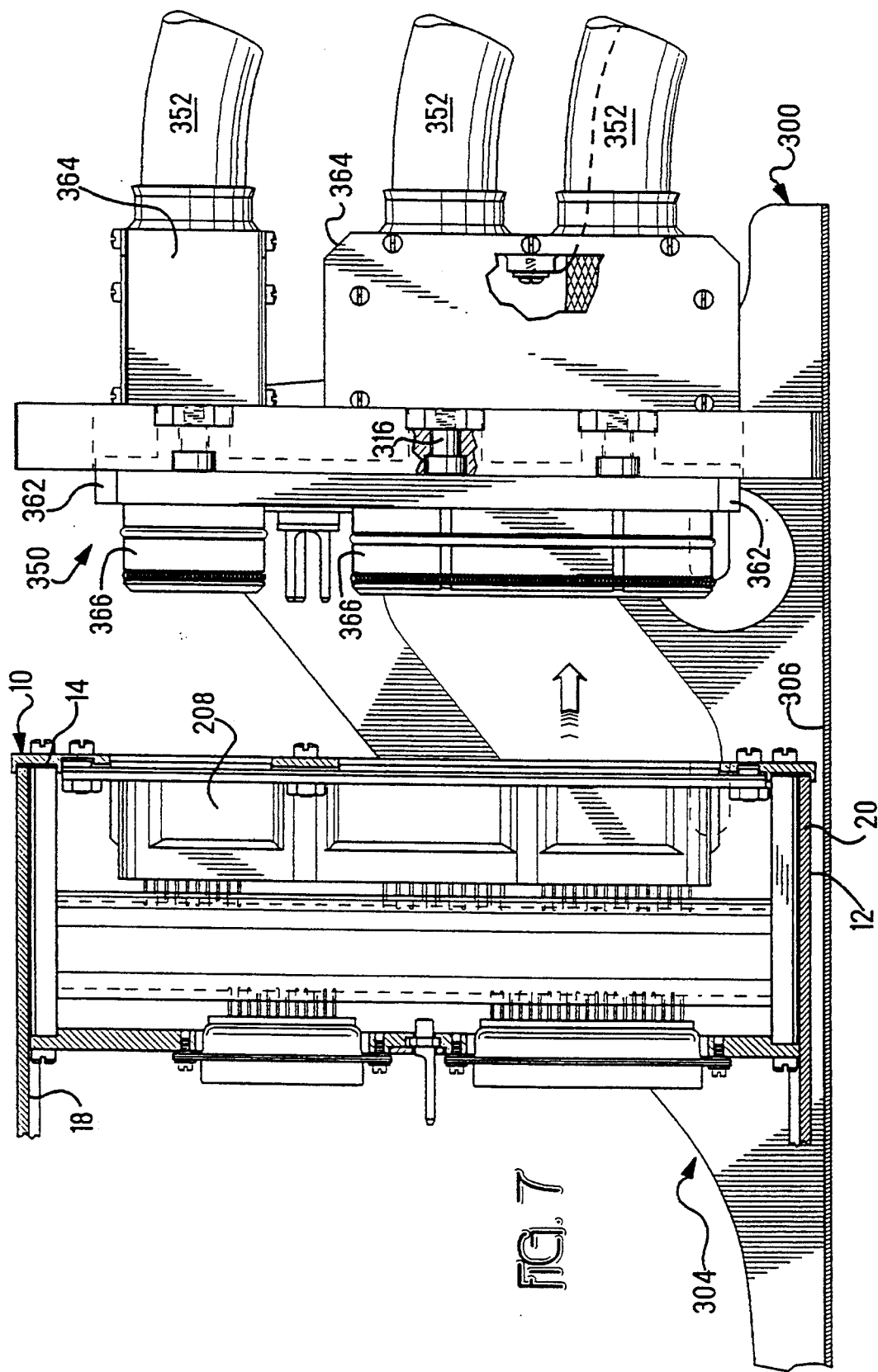

Rear wall 14 of junction box 10 shown in FIG. 5, which is shown to be a portion of backplane assembly 200, to contain an array of input/output connectors 208 mounted therealong, simultaneously matable with cable connectors 350 on frame member 310, as illustrated in FIGS. 6 and 7. Cable connectors 350 include dielectric housings 354 containing discrete terminals terminated to conductors 356 of the cables with contact sections 358 exposed at mating faces thereof. Housings 354 are affixed within cavities 360 of shroud sections 366 of shell members 362 which extending forwardly of frame member 310 matable with receptacle sections 212 of shell members 214 of connectors 208 along rear wall 14 of junction box 10.

Backplane assembly 200 for junction box 10 is illustrated more clearly in FIGS. 5 and 8 and is disclosed in U.S. patent application Ser. No. 08/076,656 filed Jun. 11, 1993. Strut members 216 extend between upper and lower edges of rearward wall section 14 and bosses 218 along upper and lower edges of forward wall section 202, thus securing forward and rearward wall sections 202,14 together. Interconnection circuitry 206 is disposed therebetween. A first connection region is defined which provides connections between circuits of the interconnection circuitry with terminals 220 of card-associated connectors 204 mounted in forward wall section 202, which mate with corresponding terminals of connectors 102 mounted on leading edges 104,134 of daughter cards 100 and matrix card 134 (see FIGS. 2 and 10). A second connection region is defined along rearward wall section 14 which provides connections between circuits with terminals 210 of input/output connectors 208 mounted in rearward wall section 14, which mate with corresponding terminals of cable connectors 350 mounted on panel member 310 of rack assembly 300 at the input/output interface.

Preferably interconnection circuitry 206 is a plurality of thin film flexible circuit elements 230 overlaid to form a laminar package. The flexible circuit elements each include defined thereon certain circuits to extend from a first connection region preferably positioned in the central portion 232 of an elongate film, across intermediate film portions 234 laterally of the first connection region, to opposed end portions 236 of the elongate film, with the opposed ends together defining the second connection region. It is seen that the plurality of flexible circuit elements 230 extend through bends of 180° at the overlaid intermediate regions to each side of the backplane assembly which are within the outer envelope of the edges of the forward and rearward wall sections 202,14 to fit within body section 12 of junction box 10.

Figure 10:
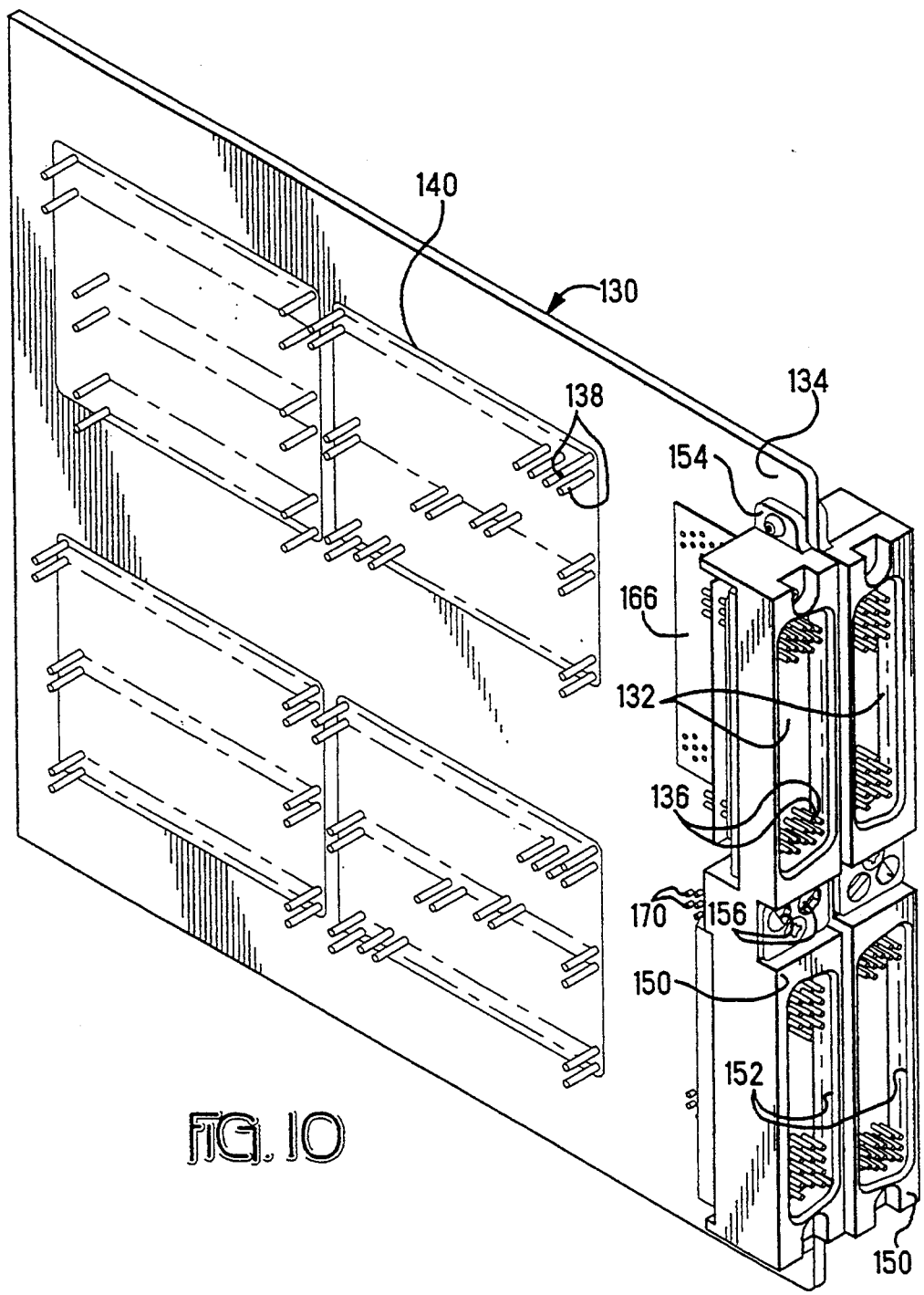
FIG. 10 is an isometric view of a matrix card for use with the backplane assembly of the junction box to integrate the circuits, and showing a pair of integral shell members containing the card-mounted connectors.
Figure 11:
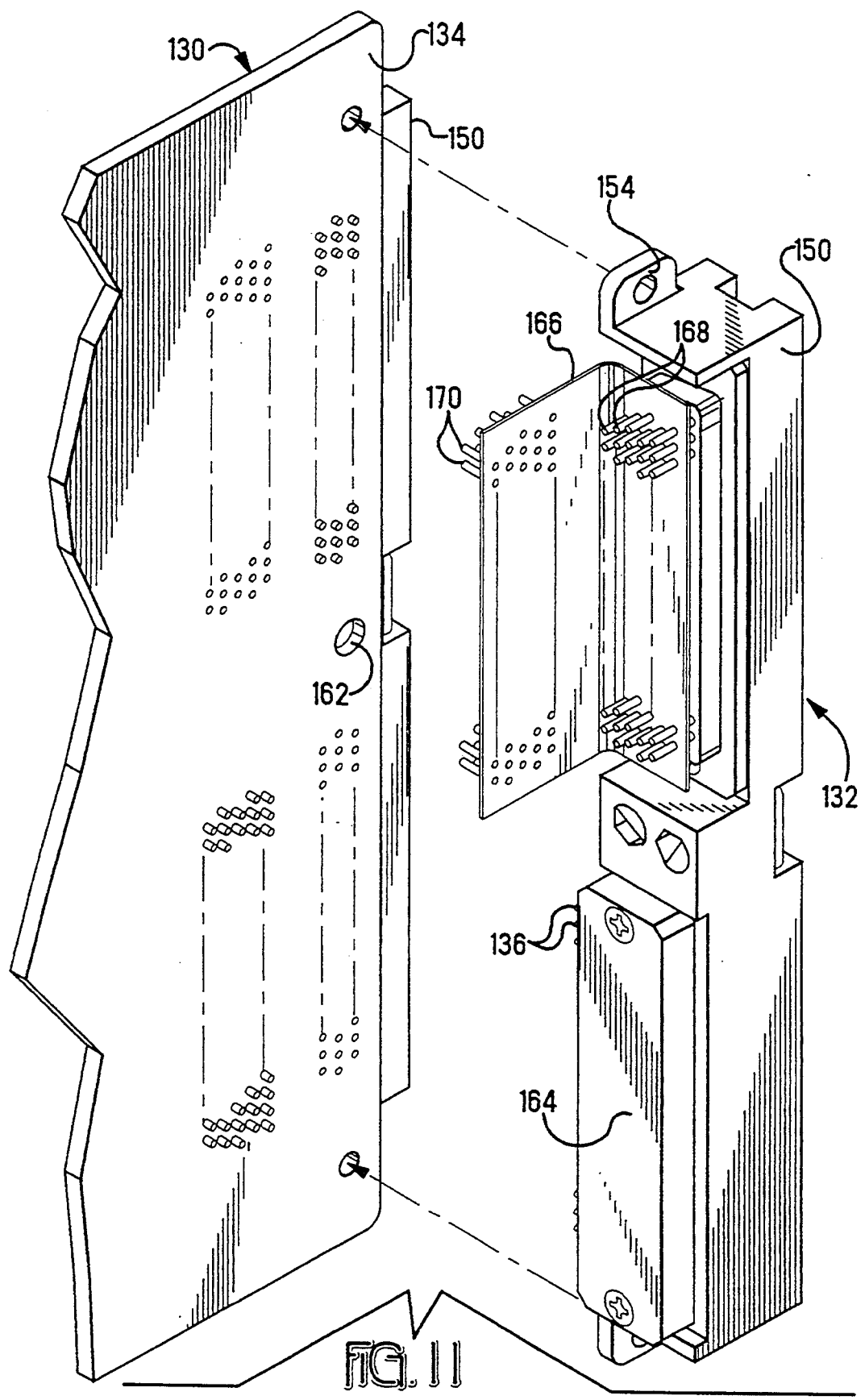
FIG. 11 illustrates an integral shell of FIG. 10 being applied to a leading edge of the matrix card.
Figure 12:
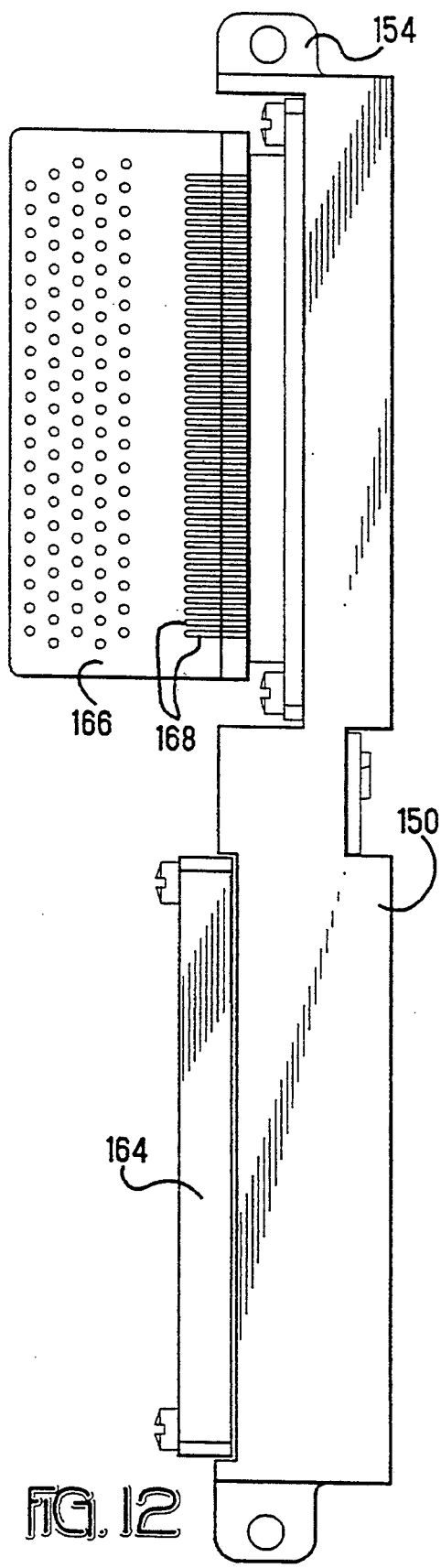
FIGS. 12 and 13 are top and elevation views of the integral shell of FIGS. 10 and 11 containing card connectors therein, with terminal arrays for termination to circuits of the card.

Input/output connectors 208 are disposed within shroud sections 212, which are shown to be sections of shell members 214 securable to rearward wall section 14 by an array of fasteners extending through aligned apertures of a mounting flange of shell member 214 and rearward wall section 14. Discrete shroud members 222 are seen (FIG. 9) fastened to forward wall section 202 to surround and protect arrays of pin contact sections of terminals 220 of card-associated connectors 204. Connector housings of connectors 204 are extended through associated cutouts of forward wall section 202 which are incrementally larger than the housings, permitting incremental transverse movement to enable precision alignment of the pin contact sections of terminals 220 with complementary socket contact sections of terminals of connectors 102,132 mounted on leading edges 104,134 of daughter cards 100 and matrix card 130 (FIG. 10).

A pair of key members 224 is seen to extend forwardly of forward wall section 202 between each pair of connectors 204 associated with each daughter card 100, for engagement with complementary key members of the daughter card connectors 102 which enables mating of the desired daughter card with the connectors at that location. Only when the associated key members at a particular daughter card location are intentionally physically positioned to be oriented to complement each other, do the card-mounted connectors 102 and the wall-mounted connectors 204 mate; otherwise such key members abut prior to connector mating because the key members are not oriented to complement each other, preventing mating of an undesired daughter card at that card location.

With reference now to FIG. 2, backplane assembly 200 is shown positioned to be inserted into rear face 24 of junction box 10. Forward wall section 202 is dimensioned and shaped so that the peripheral edge thereof just fits within the inner surfaces oft op and bottom walls 18,20 (and opposed side walls 16) of body section 12. Rearward wall section 14 is shaped and dimensioned so that its periphery abuts the rear edges of the four sides of body section 12, for fasteners to secure it to the rear face 24 of the junction box 10. Struts 216 extend between the periphery of rearward wall section 14 and the tabs 218 of forward wall section 202, are received into pairs of channels 226 in top and bottom walls 18,20 of the junction box 10 extending inwardly from rear face 24, which positions forward wall section 202 laterally for connectors 204 mounted thereto to be aligned with card guides 30 (FIG. 2) of the card-receiving region 26 forwardly thereof, all so that the wall-mounted connectors 204 are aligned with card-mounted connectors 102,132 upon insertion of the associated daughter card or the matrix card.

The junction box 10, and the backplane assembly 200 used therewith, also are especially useful to define a wire integration system, in which circuits of the daughter cards 100 can be connected as desired to any particular conductor of the input/output interface. Matrix card 130 is disclosed to be insertable into the junction box in the same manner as a daughter card at a particular location, preferably having connectors 132 mounted on both sides of leading edge 134 as shown in FIG. 10. Terminals 136 of the four connectors include contact sections electrically connected to circuits of the matrix card which extend to one or more other card terminals 138 which in turn are connected to other card terminals 138 or directly to other terminals 136 of the four connectors as desired, such as by using flexible film circuit elements 140 as shown, or alternatively by discrete wires wrapped to the card terminals 138 with conventional wire wrapping techniques. The matrix card can thus be easily programmed by utilizing flexible circuits of particular customized circuit design (or discrete wire wrap segments), which can be replaced on the matrix card if necessary.

Backplane assembly 200 accommodates the use of such a programmable circuit integration member as matrix card 130, by directing substantially all circuits of the various flexible circuit elements of the laminar array from input/output terminals 210 only to terminals in a matrix connection region with which the location of matrix card 130 would of course be aligned, from which circuit segments would extend to selected terminals associated with particular daughter cards. Thus backplane assembly 200 may be fabricated to a basic circuit configuration, with matrix card 130 providing customization for particular uses of the junction box 10, and enabling ease of reprogramming, all resulting in simplified construction of the backplane assembly which can easily handle providing circuits for over a thousand of individual terminal interconnections in a compact arrangement, as in the present design.

Referring to FIGS. 10 to 13, an integral shell member 150 of the present invention is shown which contains a pair of card-mounted connectors 134 in corresponding cavities 152. Integral shell 150 includes end flanges 154 enabling mounting to a circuit card by conventional mounting hardware such as bolts and nuts or a screw in a self-tapping hole of the shell, or by rivets, and includes a pair of key members 156 which complement key members 224 on forward wall section 202 of backplane assembly 200, shown in FIG. 9.

A centrally located reference post 160 depends from integral shell 150 and is received into a complementary alignment hole 162 through the leading edge 134 of the circuit card 130. Alignment hole 162 is precisely referenced to the array of circuit termini of the circuit card 130, and reference post 160 is precisely related to precision machined cavities 152 in which connectors 132 are secured. Once the arrays of card-connectable contact sections of terminals of connectors 132 are aligned with and soldered to circuit termini of the circuit card during connector mounting, the reference post maintains that reference through both terminal arrays across the mating faces of the connectors 132 in the shell cavities 152.

Card-connectable contact sections of terminals 136 may be conventional right-angle pin contacts insertable into through-holes of the card, as is conventional, and a protective plate 164 secured to the connector rearwardly of the right-angled terminals. Electrical connection may be attained by using flexible film circuit elements such as 166 having circuits whose termini are soldered to straight pin sections 168 of terminals of the connector at first ends, and termini are similarly soldered to headed pin members 170 to be inserted into through holes of the circuit card defining the array, and soldered. If desired a cover member (not shown) may be utilized to protect the extending ends of pin members.

Figure 13:
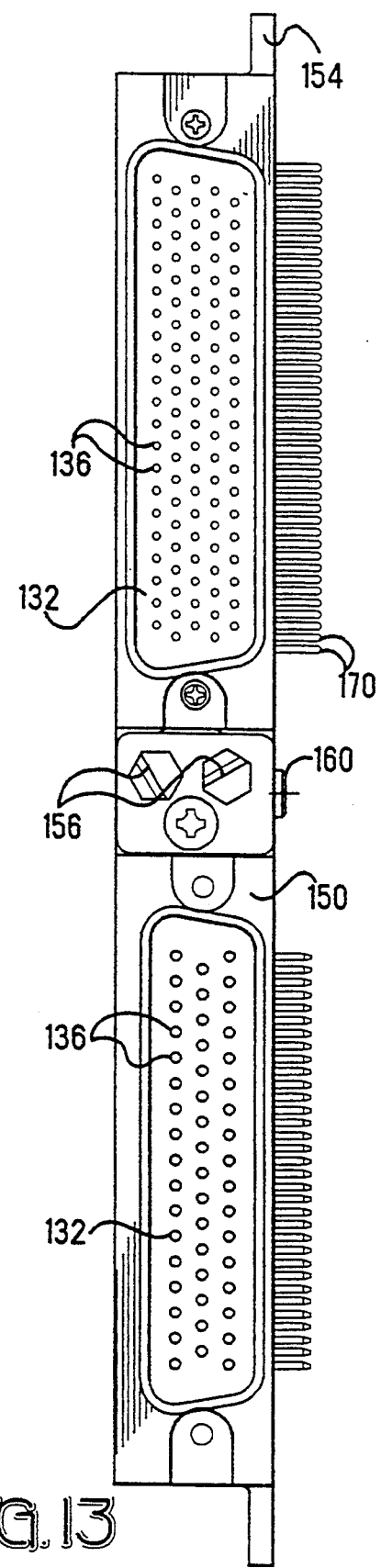

Cavities 152 of integral shell 150 can be shaped to receive housings of various sizes, as seen in FIG. 13, or various conventional designs and thereby be dissimilar. Shell portions peripherally surrounding the mating faces of the connectors are adapted to engage leading ends of shrouds 222 surrounding wall-mounted connectors 204 of backplane assembly 200, assuring that the arrays of mating terminals are aligned by causing the shrouds of wall-mounted connectors 204 to incrementally adjust transversely, as well as integral shell 150 causing the leading edge of the circuit card 130 to be adjusted incrementally transversely within card guides prior to actuation of card lock components 190 mounted within card guide channels 30 (see FIG. 2). Components 190 may be thermal card guides having Part No. 25-B-14-6 sold by E G & G Birtcher Co.

The integral shell may be used in other arrangements especially of card cages and obtain the same benefits as disclosed herein. Variations and modifications may occur to the integral shell of the embodiment disclosed herein, which may occur to the artisan, which are within the spirit of the invention and the scope of the claims.

What is claimed is:

1. An electrical connecting arrangement for interconnecting circuits of a daughter card to circuits of a backplane assembly of the type including a plurality of high-density arrays of electrical terminals having closely spaced first contact sections electrically connected to termini of respective circuits of the daughter card located proximate a leading edge thereof, the terminal arrays being elongate in a direction along the leading edge and contained within respective similarly elongate dielectric housings with closely spaced second contact sections thereof at least exposed along a housing mating face to be mated with complementary contact sections of corresponding terminals of connectors of the backplane assembly upon mating of the daughter card to the backplane assembly, and shielding provided around the dielectric housings, with the connectors of the backplane assembly being separately housed and separately mounted on the backplane assembly, and with the housings and the shielding being secured to the daughter card, the arrangement characterized in that:

an elongate integral shell member is fastened along said leading edge of said daughter card and includes a plurality of cavities extending -therethrough in which are mountable corresponding ones of said dielectric housings, defining the shielding and providing for securing the housings to the daughter card and enabling the plurality of said housings and their terminals to be manipulated as a unit during securing to the daughter card and terminating the terminals to the termini;

said shell member includes a reference post proximate the center thereof receivable into a complementary closefitting hole through said leading edge of said daughter card with said complementary hole being referenced to said plurality of arrays of termini, said reference post being precisely located with respect to all said cavities, thereby assuring that the closely spaced first contact sections of all said arrays of terminals remain referenced to the corresponding termini of the arrays of the daughter card after being terminated to the termini, and being referenced to said closely spaced second contact sections of said terminals of said arrays thereof within said housings when said housings are secured within said cavities; and said shell member is adapted to engage leading edges of a plurality of shell members of connectors mounted to said backplane assembly in a plurality of interfitting shell structures along the mating interface and cause said shell members to incrementally adjust laterally to precisely align said corresponding terminals disposed within said connectors prior to mating engagement of said second contact sections with said complementary contact sections of said corresponding terminals, whereby said integral shell member provides relief from stress on the terminations of the terminals with the termini of the circuits of the daughter card otherwise generated upon mating of the daughter card with the backplane assembly, by transmitting the forces generated by engagement with the plurality of backplane assembly shell members to the daughter card through the reference post and by being fastened to the daughter card.

2. The electrical connecting arrangement as set forth in claim 1 further characterized in that said integral shell member is conductive to provide shielding of the mating interface when electrically connected to a ground circuit of the backplane assembly.

3. The electrical connecting arrangement as set forth in claim 1 further characterized in that said cavities of said integral shell member are dissimilar, enabling said housings to be dissimilar.

4. The electrical connecting arrangement as set forth in claim 1 further characterized in that said terminals of at least one said array extend from a backplane-remote face of a respective said housing initially parallel to said daughter card and include a right angle bend to conclude in pin shaped first contact sections, said termini include pin-receiving holes therethrough, and said pin shaped first contact sections are inserted through said pin-receiving holes to define the terminations.

5. The electrical connecting arrangement as set forth in claim 4 further characterized in that said terminals of at least one said array extend from said backplane-remote face of said housing to conclude in solder tail sections adapted to be compressed against portions of traces defining said termini of said circuits whereafter they are soldered.

6. The electrical connecting arrangement as set forth in claim 1 further characterized in that said terminals of at least one said array extend from a backplane-remote face of a respective said housing initially parallel to said daughter card and include a right angle bend to conclude in pin shaped first contact sections, said termini include pin-receiving holes therethrough, and said pin shaped first contact sections are inserted through said pin-receiving holes and thereafter soldered to define the terminations, and said terminals of at least one other said array extend from said backplane-remote face of a corresponding said housing to conclude in pin sections adapted to be terminated to circuits of flexible circuit elements which are further terminated to termini of said circuits of said daughter card.

7. The electrical connecting arrangement as set forth in claim 1 further characterized in that said integral shell member includes key members matable with correspondingly programmed key members at an opposing position on an appropriate location along said backplane assembly to permit mating engagement of the appropriate daughter card thereat.

8. The electrical connecting arrangement as set forth in claim 1 further characterized in that said backplane assembly includes a panel member facing said circuit card, and said connectors are secured in cutouts through said panel member having slightly larger dimension permitting incremental lateral adjustment by said connectors upon engagement of said shell men,hers thereof with said leading edges surrounding corresponding said cavities of said integral shell member mounted on said leading end of said daughter card, during daughter card mating with said backplane assembly.

* * * * *